(12) United States Patent
Tsai et al.

(10) Patent No.: US 11,587,853 B2
(45) Date of Patent: Feb. 21, 2023

(54) SEMICONDUCTOR DEVICES HAVING A SERIAL POWER SYSTEM

(71) Applicant: MEDIATEK INC., Hsin-Chu (TW)

(72) Inventors: Yi-Tao Tsai, Hsinchu (TW); Yun-Tai Hsiao, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 296 days.

(21) Appl. No.: 16/843,838

(22) Filed: Apr. 8, 2020

(65) Prior Publication Data

US 2021/0066169 A1 Mar. 4, 2021

Related U.S. Application Data

(60) Provisional application No. 62/894,995, filed on Sep. 3, 2019.

(51) Int. Cl.
*H01L 23/49* (2006.01)

(52) U.S. Cl.
CPC .................... *H01L 23/49* (2013.01)

(58) Field of Classification Search
CPC ...................................... H01L 23/49
See application file for complete search history.

(56) References Cited

U.S. PATENT DOCUMENTS

| 6,031,413 A | 2/2000 | Mizoguchi |
| 9,645,604 B1 | 5/2017 | Nebesnyi |
| 2006/0114019 A1 | 6/2006 | Sutardja |
| 2010/0259299 A1 | 10/2010 | Dennard |
| 2012/0050697 A1* | 3/2012 | Suzuki .................. H05B 45/56 315/185 R |
| 2016/0072499 A1 | 3/2016 | Ichikawa |
| 2016/0315184 A1 | 10/2016 | Ishimaru |
| 2018/0063960 A1* | 3/2018 | Sasaki ..................... H01L 24/16 |

FOREIGN PATENT DOCUMENTS

| CN | 105895598 A | 8/2016 |
| JP | 2000-349603 A | 12/2000 |
| TW | 200811970 | 3/2008 |
| TW | 201044556 A1 | 12/2010 |

OTHER PUBLICATIONS

English Machine Translation of CN 205139762, Zhang et al., LinearDifference Hall Voltage Generator With Flat Structure, published Apr. 6, 2016.*

* cited by examiner

*Primary Examiner* — Peniel M Gumedzoe

(74) *Attorney, Agent, or Firm* — Winston Hsu

(57) ABSTRACT

A semiconductor device includes a plurality of functional blocks, each being configured to provide at least one predetermined function. The functional blocks at least include a first functional block and a second functional block. The first functional block and the second functional block are coupled in serial with a predetermined current flowing therethrough.

10 Claims, 11 Drawing Sheets

| | | | | |
|---|---|---|---|---|
| 1 | D3TXO | DVDD_3 (PIN31) | D3TXI | 30 |
| 2 | D3RXO | | D3RXI | 29 |
| 3 | D3RXDI | | D3RXDO | 28 |
| 4 | D3CLKO | 830 | D3CLKI | 27 |
| 5 | D3RSTBO | | D3RSTBI | 26 |
| 6 | D2RSTBI | DVSS_3 (PIN32) | D2RSTBO | 25 |
| 7 | D2CLKI | DVDD_2 (PIN33) | D2CLKO | 24 |
| 8 | D2RXDO | | D2RXDI | 23 |
| 9 | D2RXI | 820 | D2RXO | 22 |
| 10 | D2TXI | | D2TXO | 21 |
| 11 | D1TXO | DVSS_2 (PIN34) | D1TXI | 20 |
| 12 | D1RXO | DVDD_1 (PIN35) | D1RXI | 19 |
| 13 | D1RXDI | | D1RXDO | 18 |
| 14 | D1CLKO | 810 | D1CLKI | 17 |
| 15 | D1RSTBO | DVSS_1 (PIN36) | D1RSTBI | 16 |

SEMICONDUCTOR DEVICES HAVING A SERIAL POWER SYSTEM

CROSS REFERENCE TO RELATED APPLICATIONS

This application claims the benefit of U.S. Provisional Application No. 62/894,995 filed 2019 Sep. 3, the entirety of which is incorporated by reference herein.

BACKGROUND

An SiP (System in Package or System-in-a-Package) includes one or more integrated circuits enclosed in a single module (e.g., a single package). The SiP may perform many (or all) of the functions of an electronic system. An example of an SiP may include several dies combined with passive components (e.g., resistors and capacitors) mounted on a single substrate. Mounting all the components on the single substrate provides a complete functional unit that can be built in a multi-die package and few external components may be needed to make the device work.

For an electronic system having one or more SiP packages, chips or SoC (System on Chip) integrated therein, how to reduce power consumption is always an issue of concern.

SUMMARY

It is one object of the present invention to provide novel structure designs of a semiconductor device realizing or having a serial power system. In the embodiments of the invention, the power consumption can be greatly reduced as compared to the conventional design. In addition, the package-size of the proposed structure is smaller than that of the conventional structure, and the BOM (Bill of Materials) list and circuit area on PCB can also be saved.

According to one embodiment, a semiconductor device comprises a plurality of functional blocks, each being configured to provide at least one predetermined function. The functional blocks at least comprise a first functional block and a second functional block. The first functional block and the second functional block are coupled in serial with a predetermined current flowing therethrough.

According to another embodiment, a semiconductor device comprises a printed circuit board and a plurality of functional blocks. Each functional block is disposed on the printed circuit board and configured to provide at least one predetermined function. The functional blocks at least comprise a first functional block and a second functional block. The first functional block and the second functional block are coupled in serial with a first predetermined current flowing therethrough. At least one control signal received from the first functional block is relayed to the second functional block.

According to yet another embodiment, a semiconductor device comprises a plurality of semiconductor dies. Each semiconductor die is configured to provide at least one predetermined function.

The semiconductor dies at least comprise a first semiconductor die and a second semiconductor die. The first semiconductor die has a first power pad and first ground pad. The second semiconductor die has a second power pad and a second ground pad. The first power pad of the first semiconductor die and the second ground pad of the second semiconductor die are electrically connected to each other and equipotential.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 8 is a top view diagram of a semiconductor package according to another embodiment of the invention.

DETAILED DESCRIPTION

In order to reduce power consumption, novel structure designs of a semiconductor device realizing a serial power system is provided.

According to an embodiment of the invention, a semiconductor device may comprise a plurality of functional blocks. Each functional block is configured to provide at least one predetermined function. For example, each functional block may be configured to provide a CHF (cryptographic hash function) calculation function, such as SHA (Secure Hash Algorithm) calculation function. According to an embodiment of the invention, the functional block may be a circuit, a semiconductor die, an IC, a chip, an SoC die, an SoC package, a SiP package, a semiconductor package, or a package assembly.

The functional blocks at least comprise a first functional block and a second functional block. According to an embodiment of the invention, the first functional block and the second functional block are coupled in serial with a predetermined current flowing therethrough.

In the first aspect of the invention, the functional blocks are semiconductor dies packaged in a semiconductor package. In the embodiments of the invention, the semiconductor dies packaged in one semiconductor package, such as an SiP (System in Package) package, may be coupled in serial between a power node and a ground node with a predetermined current flowing therethrough.

Figure 1:
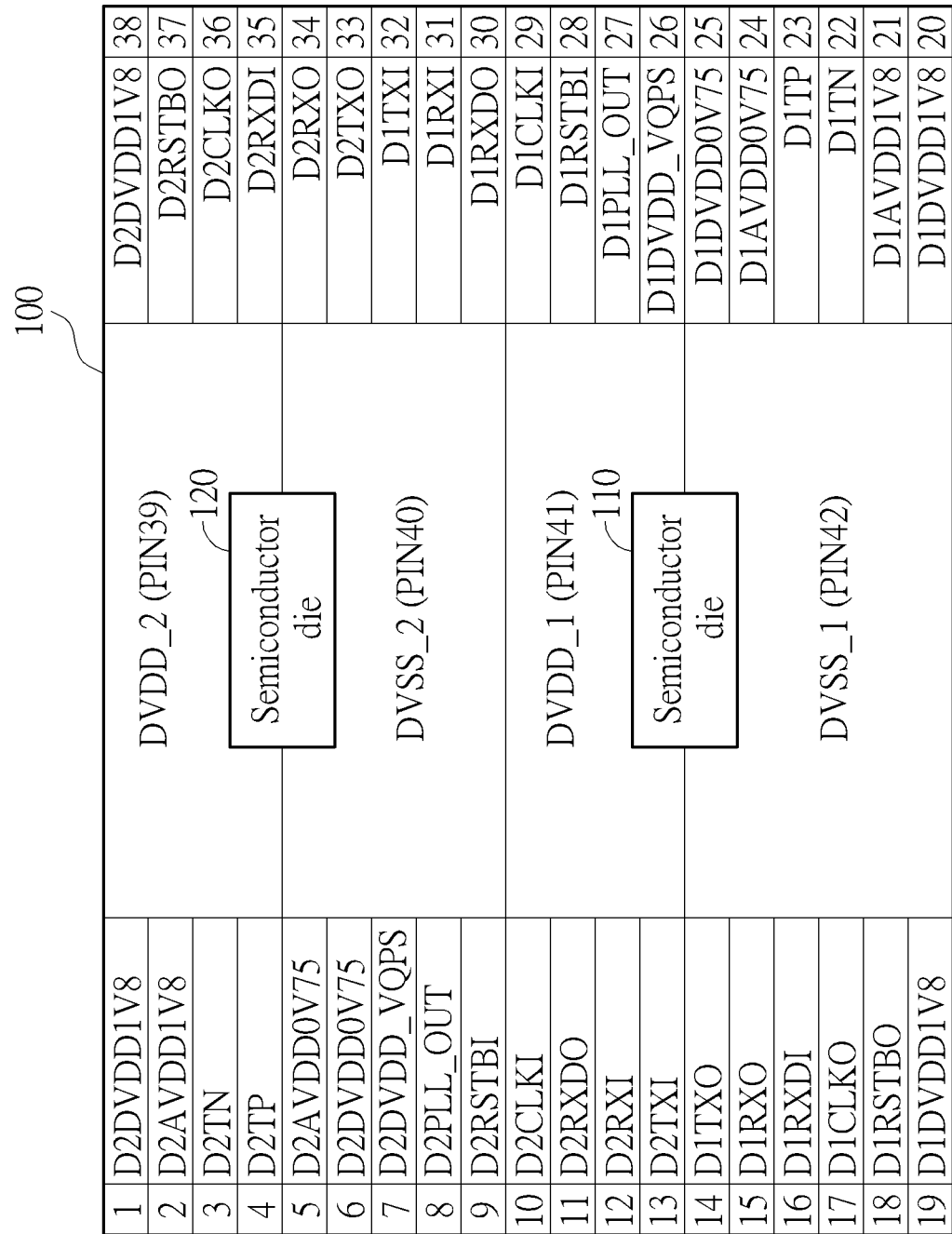
FIG. 1 is a top view diagram of a semiconductor package according to an embodiment in the first aspect of the invention.

FIG. 1 is a top view diagram of a semiconductor package according to an embodiment in the first aspect of the invention. In this embodiment, the semiconductor device 100 may be a semiconductor package or a chip. The semiconductor device 100 comprises two semiconductor dies 110 and 120 packaged therein. The semiconductor dies 110 and 120 may be configured to provide the same function. The pins (for example, the pins labeled with the numbers 1~38) marked by the leading term "D1" are the pins associated with the semiconductor die 110 and the pins marked by the leading term "D2" are the pins associated with the semiconductor die 120. It should be noted that the pin map shown in FIG. 1 is only a schematic, and the invention should not be limited thereto.

According to an embodiment of the invention, the semiconductor dies 110 and 120 are coupled in serial by electrically connecting the power pad of the semiconductor die 110 to the ground pad of the semiconductor die 120. As shown in FIG. 1, the power pad (or, the associated power pin) DVDD_1 of the semiconductor die 110 is electrically connected to the ground pad (or, the associated ground pin) DVSS_2 of the semiconductor die 120. In addition, the power pad (or, the associated power pin) DVDD_2 of the semiconductor die 120 may be configured to receive power from an external power source via a power node or a power pin of the semiconductor device 100, and the ground pad (or, the associated ground pin) DVSS_1 of the semiconductor die 110 may be further coupled to a ground node.

Since the power pad DVDD_1 of the semiconductor die 110 is electrically connected to the ground pad DVSS_2 of the semiconductor die 120, the power pad DVDD_1 of the semiconductor die 110 and the ground pad DVSS_2 of the semiconductor die 120 are equipotential.

According to an embodiment of the invention, the semiconductor die 110/120 may comprise at least one computing circuit (for example, the computing circuit configured to perform the CHF or SHA calculation), at least one PLL (Phase-Locked Loop) circuit configured to generate an internal clock signal, at least one I/O pad, and may further comprise some peripheral or supplementary components. Those components may be triggered by different power. For example, the power DVDD may be provided for triggering the computing circuit, the power AVDD1V8 may be provided for triggering the PLL circuit, and the power AVDD0V75 may be provided for triggering the I/O pad.

In an embodiment of the invention, the serial power system is implemented by coupling the power DVDD utilized for triggering the computing circuit in a serial manner, where the computing circuit provides the main function of the semiconductor device 100.

Figure 2:
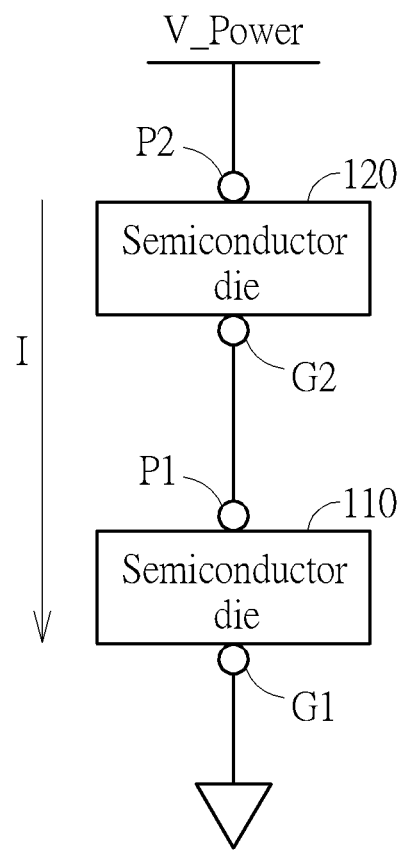
FIG. 2 is an equivalent circuit diagram of two semiconductor dies coupled in serial according to an embodiment in the first aspect of the invention.

FIG. 2 is an equivalent circuit diagram of two semiconductor dies coupled in serial according to an embodiment in the first aspect of the invention. As shown in FIG. 2, the semiconductor dies 110 and 120 are coupled in serial between the power node for receiving the power V_Power and the ground node. The power V_Power may be provided to the power pad P2 of the semiconductor die 120, and the ground pad G1 of the semiconductor die 110 may be electrically connected to the ground node. The predetermined current I (that is, the same current) may flow through the semiconductor dies 120 and 110 when the power V_Power is supplied.

According to an embodiment of the invention, the power pad P1 of the semiconductor die 110 and the ground pad G2 of the semiconductor die 120 are electrically connected to each other within the semiconductor package. For this case, the power pad DVDD_1 of the semiconductor die 110 and the ground pad DVSS_2 of the semiconductor die 120 as shown in FIG. 1 may form a whole piece (that is, the black line between the power pad DVDD_1 and the ground pad DVSS_2 in FIG. 1 should be removed). It should be understood that the black line between the power pad DVDD_1 and the ground pad DVSS_2 in FIG. 1 are shown for the purpose to allow readers to easily distinguish between two blocks, therefore, the invention should not be limited thereto.

According to another embodiment of the invention, the power pad DVDD_1 of the semiconductor die 110 and the ground pad DVSS_2 of the semiconductor die 120 may be electrically connected to each other via at least one connecting element on a printed circuit board (PCB), an interposer and/or a substrate. According to an embodiment of the invention, the connecting element may be, for example but not limited to, the Redistribution Layer (RDL) trace, PCB trace, the connecting bump (such as the solder ball), the bonding wire, through silicon via (TSV) or others.

Figure 3:
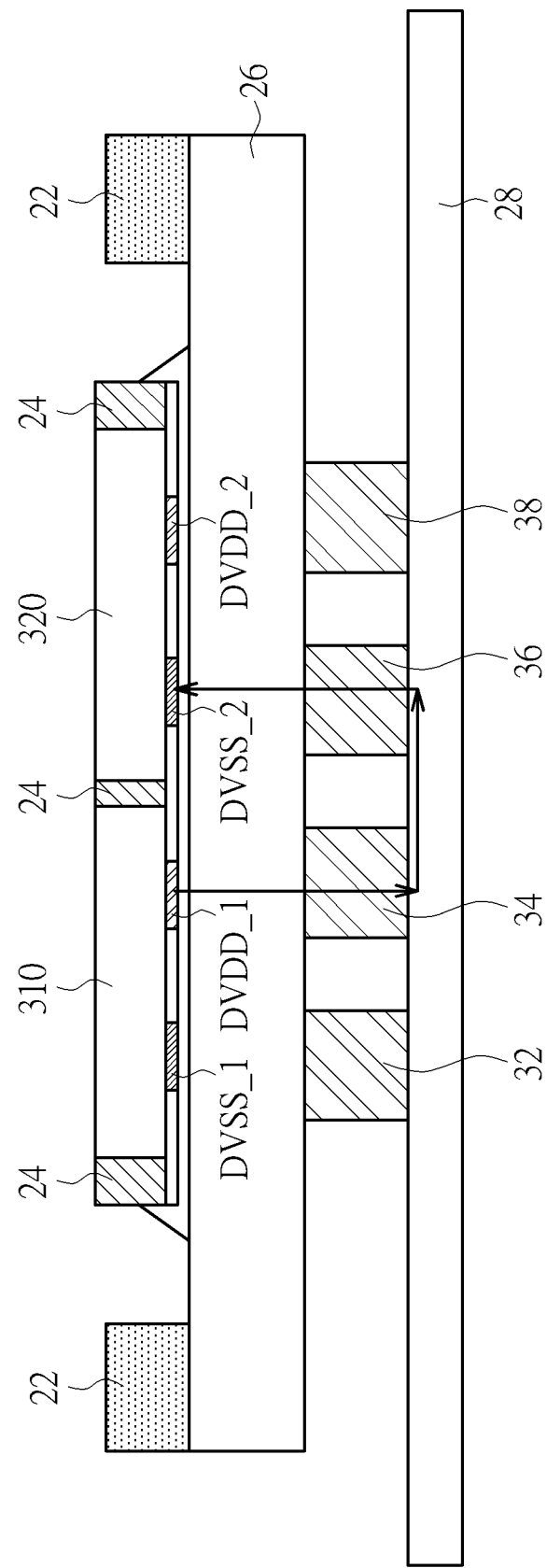
FIG. 3 is a schematic, cross-sectional diagram of the semiconductor package as illustrated in FIG. 1 according to an embodiment in the first aspect of the invention.

FIG. 3 is a schematic, cross-sectional diagram of the semiconductor package as illustrated in FIG. 1 according to an embodiment in the first aspect of the invention. In an embodiment of the invention, a semiconductor package having exposed dies is provided. The molding compound 24 encapsulates the semiconductor dies 310 and 320. The stiffener ring 22 may be disposed along the perimeter of the package substrate 26. The semiconductor package may be a land grid array (LGA) type package.

Through the connecting elements 32, 34, 36 and 38, the semiconductor package may be mounted on PCB 28 or a system board. According to an embodiment of the invention, for example, the connecting element 32 is associated with the ground pad DVSS_1 of the semiconductor die 310, the connecting element 34 is associated with the power pad DVDD_1 of the semiconductor die 310, the connecting element 36 is associated with the ground pad DVSS_2 of the semiconductor die 320, and the connecting element 38 is associated with the power pad DVDD_2 of the semiconductor die 320.

According to an embodiment of the invention, the connecting elements 34 and 36 are electrically connected to each other via the substrate 26 and/or the PCB 28. The ground pad DVSS_1 is electrically connected to the ground node and the power pad DVDD_2 is electrically connected to the power node.

Besides implementing the serial power system within the semiconductor package as the embodiments in the first aspect of the invention illustrated above, in the second aspect of the invention, the serial power system may also be implemented within a semiconductor die. In the second aspect of the invention, the semiconductor device may be a semiconductor die.

Figure 4:
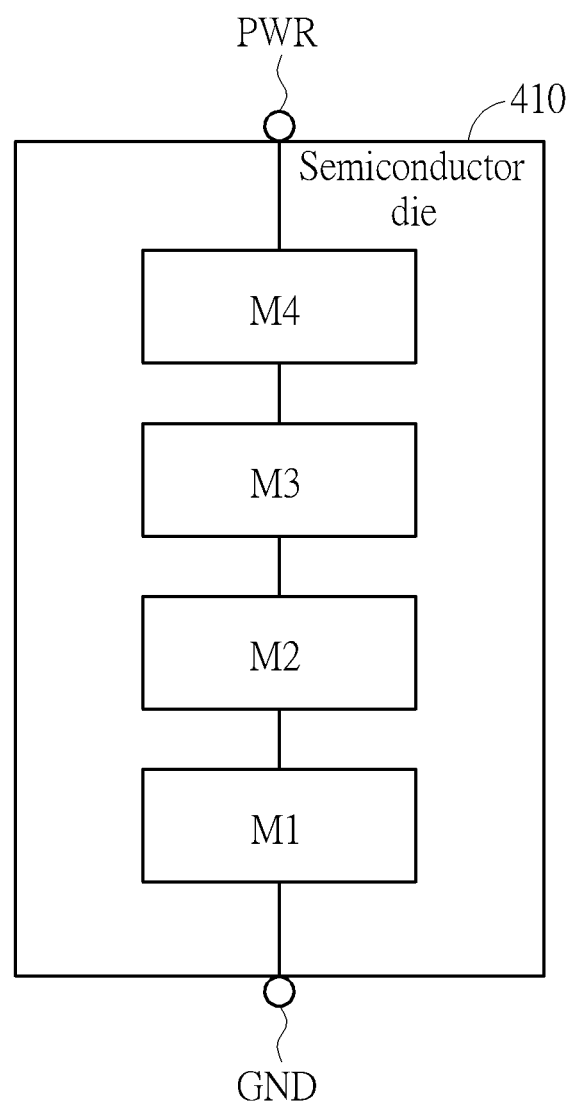
FIG. 4 is a block diagram showing anon die serial power system according to an embodiment of the second aspect of the invention.

FIG. 4 is a block diagram showing an on die serial power system according to an embodiment of the second aspect of the invention. In this embodiment, the functional block may be a computing circuit macro, and each computing circuit macro may comprise one or more computing circuits. According to an embodiment of the invention, the semiconductor die 410 may comprise a plurality of computing circuit macros, such as the computing circuit macros M1~M4. The computing circuit macros M1~M4 are coupled in serial. Each computing circuit macro may comprise one or more computing circuits. Each computing circuit is configured to provide the predetermined function, such as CHF calculation, SHA calculation, or others. Therefore, the computing circuit macros M1~M4 may be configured to provide the same function. According to an embodiment of the invention, when there is more than one computing circuit comprised in one computing circuit macro, the computing circuits may be coupled in parallel or in serial.

As shown in FIG. 4, a power node of the computing circuit macro M4 for receiving the supplied power is coupled to the power node PWR or the power pad (or, the associated power pin) of the semiconductor die 410. A power node of the computing circuit macro M3 is coupled to the ground node of the computing circuit macro M4. A power node of the computing circuit macro M2 is coupled to the ground node of the computing circuit macro M3. A power node of the computing circuit macro M1 is coupled to the ground node of the computing circuit macro M2. The ground node of the computing circuit macro M1 is coupled to the power node GND or the ground pad (or, the associated ground pin) of the semiconductor die 410.

In this embodiment, among two adjacent computing circuit macros coupled in serial, the power node of the lower computing circuit macro and the ground node of the upper computing circuit macro are equipotential. In addition, when the power is supplied, a predetermined current (that is, the same current) will flow through the computing circuit macros M4~M1.

In the third aspect of the invention, the serial power system may also be implemented on the PCB. In the third aspect of the invention, the functional blocks coupled in serial in the semiconductor device may be the semiconductor packages, the ICs or the chips.

Figure 5:
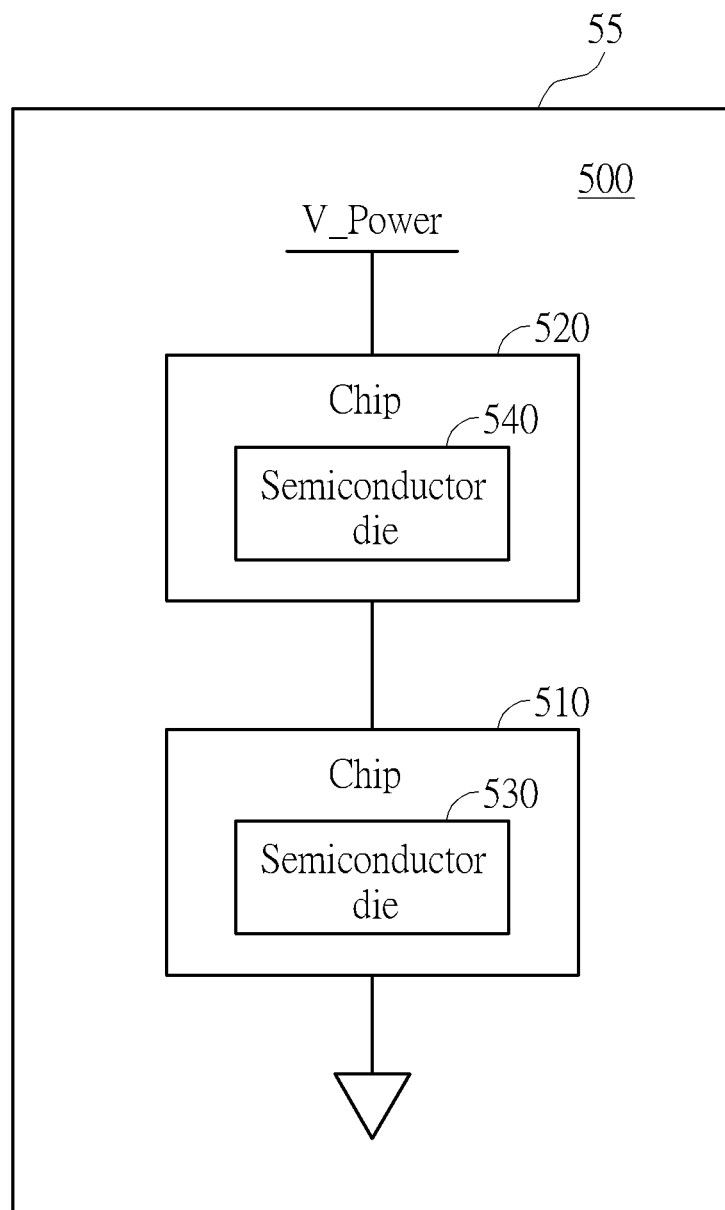
FIG. 5 is a schematic diagram showing two chips coupled in serial on the PCB according to an embodiment of the invention.

FIG. 5 is a schematic diagram showing two chips coupled in serial on the PCB according to an embodiment of the invention. As shown in FIG. 5, the semiconductor device 55 may comprise chips 510 and 520 mounted on the PCB 500 and coupled in serial between the power node for receiving the power V_Power and the ground node. A power pin of the chip 520 is electrically connected to the power node. A ground pin of the chip 510 is electrically connected to the ground node. A power pin of the chip 510 is electrically connected to the ground pin of the chip 520. The power pin of the chip 510 and the ground pin of the chip 520 are equipotential. The chips 510 and 520 may be electrically connected to each other via at least one connecting element of the PCB/and or the substrate thereon. When the power V_Power is supplied, a predetermined current (that is, the same current) will flow through the chips 520 and 510.

According to an embodiment of the invention, the chips 510 and 520 may comprise one or more semiconductor dies packaged therein, such as the semiconductor dies 530 and 540, and are configured to provide the same function. When there are more than one semiconductor die packaged in one chip, the semiconductor dies may be coupled in serial between the power node and the ground node as the embodiment in the first aspect of the invention as illustrated above. In addition, each semiconductor die may further comprise one or more computing circuits or one or more computing circuit macros. When there are more than one computing circuit or more than one computing circuit macro comprised in one semiconductor die, the computing circuits or computing circuit macros may be coupled in serial between the power node and the ground node as the embodiment in the second aspect of the invention as illustrated above.

According to an embodiment of the invention, it is preferably for the functional blocks coupled in serial and having the current flowing therethrough to have similar characteristics. To be more specific, in the first aspect of the invention, the semiconductor dies coupled in serial preferably have similar characteristics. In the second aspect of the invention, the computing circuits or computing circuit macros coupled in serial preferably have similar characteristics.

In the third aspect of the invention, the chips coupled in serial preferably have similar characteristics.

According to an embodiment of the invention, the characteristics may be, for example but not limited to, an equivalent impedance, a conducting current, or a leakage temperature of the chip, the semiconductor die, the computing circuit macro or the computing circuit, or others.

Here, 'similar' may refer to that a difference between two corresponding values is less than a predetermined value.

As an example, according to an embodiment of the invention, a difference between an equivalent impedance of the semiconductor die 110 and an equivalent impedance of the semiconductor die 120 is less than a predetermined value. As another example, a difference between the equivalent impedance of arbitrary two of the computing circuit macros M1~M4 is less than a predetermined value. As yet another example, a difference between an equivalent impedance of the chip 510 and an equivalent impedance of the chip 520 is less than a predetermined value.

According to the embodiments of the invention, based on the proposed structures as illustrated above and corresponding routings on the PCB, one or more control signals may be relayed between functional blocks.

Figure 6:
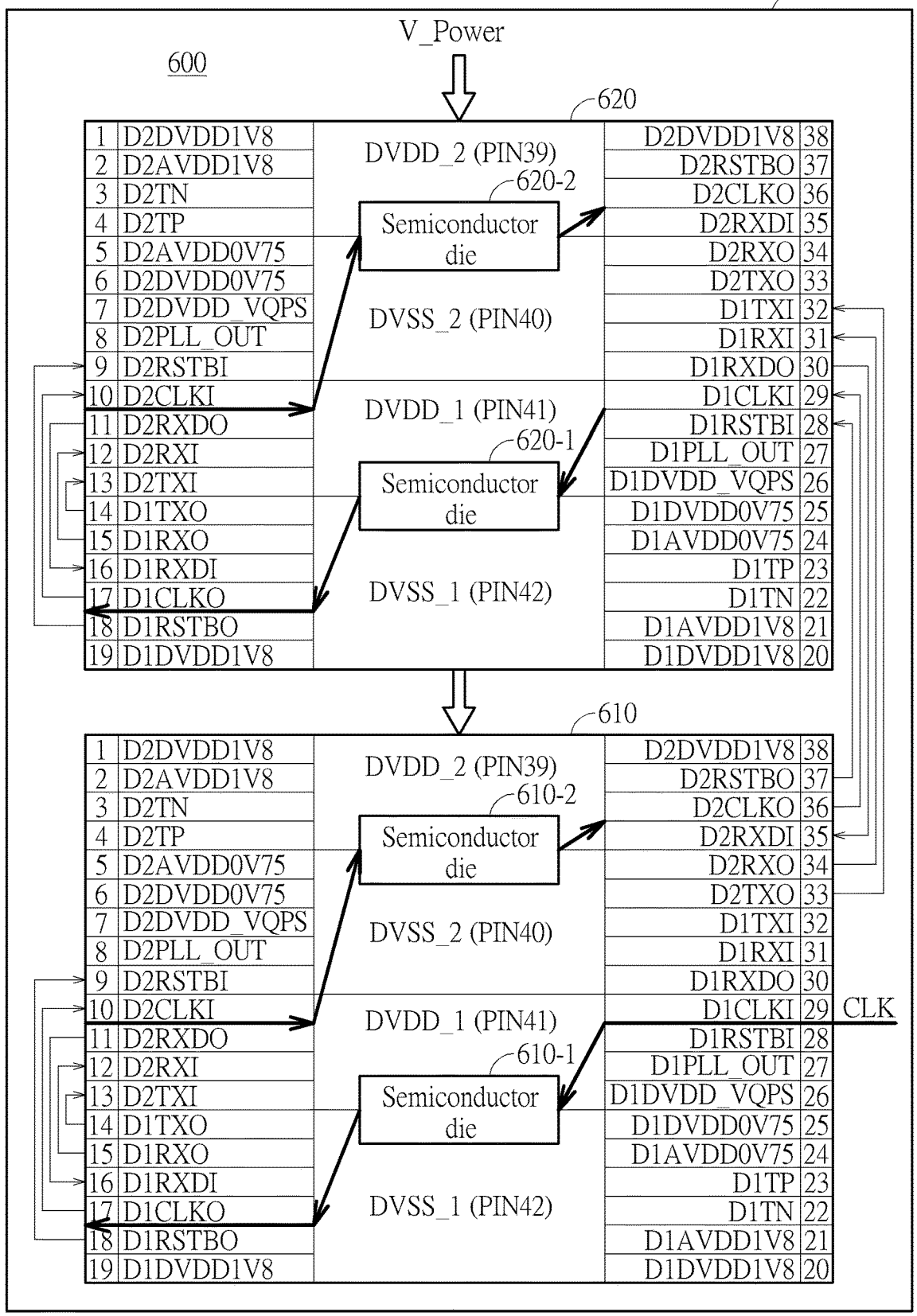
FIG. 6 is a schematic diagram showing two chips coupled in serial on the PCB according to another embodiment of the invention.

FIG. 6 is a schematic diagram showing two chips (or, semiconductor packages) coupled in serial on the PCB according to another embodiment of the invention, where each chip has two semiconductor dies packaged therein, and the semiconductor dies packaged in one chip are coupled in serial. In this embodiment, the functional blocks are chips disposed on the PCB and configured to provide at least one predetermined function (e.g. the functional blocks are configured to provide the same function).

As shown in FIG. 6, the semiconductor device 65 may comprise chips 610 and 620 mounted on the PCB 600 and coupled in serial between the power node for receiving the power V_Power and the ground node. A power pin of the chip 620 is electrically connected to the power node. A ground pin of the chip 610 is electrically connected to the ground node. A power pin of the chip 610 is electrically connected to the ground pin of the chip 620. The chips 610 and 620 may be electrically connected to each other via at least one connecting element of the PCB and/or the substrate thereon. When the power V_Power is supplied, a predetermined current (that is, the same current) will flow through the chips 620 and 610.

According to an embodiment of the invention, the chips 610 and 620 respectively comprise two semiconductor dies packaged therein, such as the semiconductor dies 610-1 and 610-2 and the semiconductor dies 620-1 and 620-2. The structure of the semiconductor dies coupled in serial and packaged in the chip 610 and/or 620 is similar to the structure shown in FIG. 1. Therefore, descriptions of the circuit structure within the chip or the semiconductor package having semiconductor dies coupled in serial may refer to the descriptions of FIG. 1, and are omitted here for brevity. In addition, the structure of the chips or the semiconductor packages coupled in serial on the PCB is similar to the structure shown in FIG. 5. Therefore, descriptions of the circuit structure of a semiconductor device having chips or semiconductor packages coupled in serial may refer to the descriptions of FIG. 5, and are omitted here for brevity.

According to an embodiment of the invention, at least one control signal, such as the clock signal or the strobe signal, is relayed from one chip (e.g. chip 610) (or, one semiconductor package) to another chip (e.g. chip 620) (or, another semiconductor package). In an embodiment of the invention, at least one control signal output pin of chip 610 is electrically connected to a control signal input pin of chip 620 via at least one connecting element of the PCB and/or the substrate thereon.

As shown in FIG. 6, pin 36, which is a clock signal output pin D2CLKO, of chip 610 is electrically connected to pin 29, which is a clock signal input pin D1CLKI, of chip 620.

In addition, according to an embodiment of the invention, at least one control signal, such as the clock signal or the strobe signal, is relayed from one semiconductor die to another semiconductor die within the same chip (or, the semiconductor package). For example, at least one control signal output pad of one semiconductor die is electrically connected to a control signal input pad of another semiconductor die within the same chip via at least one connecting element of the PCB and/or the substrate thereon.

As shown in FIG. 6, pin 17, which is a clock signal output pin D1CLKO, of chip 610 is electrically connected to pin 10, which is a clock signal input pin D2CLKI, of chip 610, where pin 17 is the pin associated with the semiconductor die 610-1 and is electrically connected to a corresponding control signal output pad of the semiconductor die 610-1, and pin 10 is the pin associated with the semiconductor die 610-2 and is electrically connected to a corresponding control signal input pad of the semiconductor die 610-2.

Via the routings on PCB 600 and the internal signal transmission paths within chips as shown in FIG. 6, a control signal, such as the clock signal CLK, received from an external device, such as a CPU or an external clock source, via pin 29 of chip 610 may be routed or transmitted from the semiconductor die 610-1 to the semiconductor die 610-2, then routed or transmitted to the semiconductor die 620-1, and finally routed or transmitted to the semiconductor die 620-2. For another signal to be transmitted from the semiconductor device 65 to the external device (e.g. an CPU), the signal may be routed or transmitted to the external device in a reverse direction.

Take the pins shown in FIG. 6 as an example, the clock signal CLK received from an external device via pin 29 of chip 610 may be routed or transmitted to pin 17 of the chip 610 via an internal signal transmission path within chip 610, and then routed or transmitted to pin 10 of chip 610 via a signal transmission path (e.g. the connecting element as illustrated above) on the PCB 600. The clock signal CLK may be further routed or transmitted to pin 36 of the chip 610 via another internal signal transmission path within chip 610, and then routed or transmitted to pin 29 of chip 620 via another signal transmission path (e.g. the connecting element as illustrated above) on the PCB 600.

The clock signal CLK may be further routed or transmitted within chip 620 in the similar way. In this manner, the control signal received from an external device may be relayed from the semiconductor die 610-1 to the semiconductor die 610-2 and the semiconductor die 620-1, and then to the semiconductor die 620-2.

In the embodiments of the invention, based on the proposed structures, a smooth layout on package-substrate routing and a straightforward layout on PCB routing, such as the routing shown in FIG. 6, can be achieved.

It should be noted that besides the control signal(s), the input/output signal (s) may also be relayed from one chip to another and from one semiconductor die to another based on the routings on the PCB and the proposed structures. As shown in FIG. 6, the reception/transmission output pin (e.g. the pins labeled with the ending term "RXO" or "TXO") associated with one semiconductor die may be electrically connected to the reception/transmission input pin (e.g. the pins labeled with the ending term "RXI" or "TXI") associated with another semiconductor die within the same chip. In addition, the reception/transmission output pin of one chip may be electrically connected to the reception/transmission input pin of another chip within the same semiconductor device.

In some embodiments of the invention, the control signals may also be relayed among more than two functional blocks.

Figure 7:
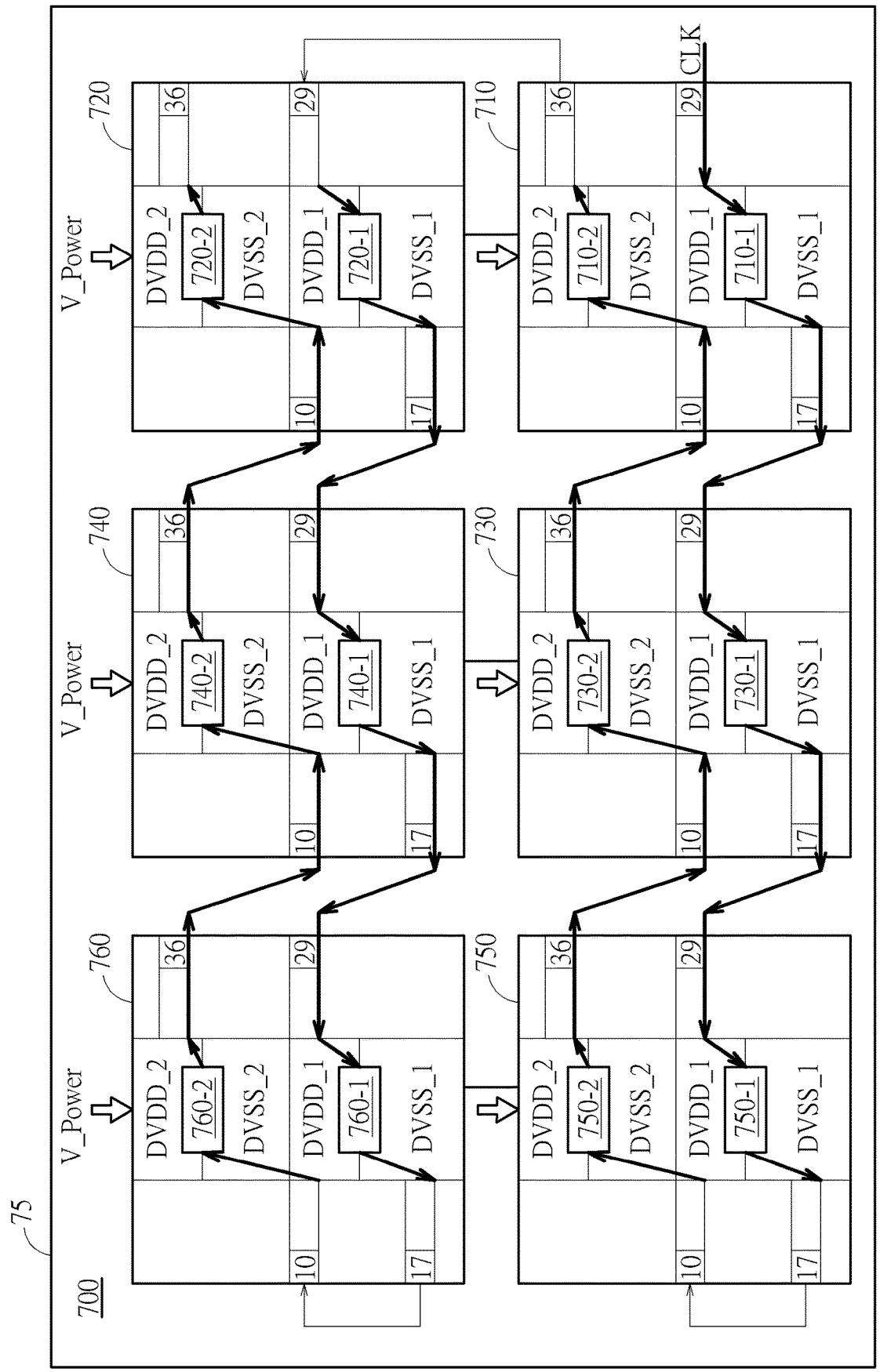
FIG. 7 is a schematic diagram showing six chips on the PCB according to an embodiment of the invention.

FIG. 7 is a schematic diagram showing six chips (or, semiconductor packages) on the PCB according to an embodiment of the invention, where each chip has two semiconductor dies packaged therein, and the semiconductor dies packaged in one chip are coupled in serial. The semiconductor dies or chips disposed on the PCB 700 are configured to provide the same function.

In this embodiment, the semiconductor device 75 may comprise chips 710~760 mounted on the PCB 700. The chips 710 and 720, 730 and 740 and 750 and 760 are respectively coupled in serial between the power node for receiving the power V_Power and the ground node. In addition, the semiconductor device 75 may further comprise a parallel structure in which three chip sets (that is, the chip set comprising chips 710 and 720, the chip set comprising chips 730 and 740 and the chip set comprising chips 750 and 760) are coupled in parallel.

The power pins of the chips 720, 740 and 760 are electrically connected to the power node. The ground pins of the chips 710, 730 and 750 are electrically connected to the ground node. The power pin of the chip 710 is electrically connected to the ground pin of the chip 720 via at least one connecting element of the PCB 700 and/or the substrate thereon. When the power V_Power is supplied, a predetermined current (that is, the same current) will flow through the chips 720 and 710. Similarly, the power pin of the chip 730 is electrically connected to the ground pin of the chip 740 via at least one connecting element of the PCB 700 and/or the substrate thereon. When the power V_Power is supplied, a predetermined current (that is, the same current) will flow through the chips 740 and 730. Similarly, the power pin of the chip 750 is electrically connected to the ground pin of the chip 760 via at least one connecting element of the PCB 700 and/or the substrate thereon. When the power V_Power is supplied, a predetermined current (that is, the same current) will flow through the chips 760 and 750.

According to an embodiment of the invention, the chips 710~760 respectively comprise two semiconductor dies packaged therein, such as the semiconductor dies 710-1 and 710-2, 720-1 and 720-2, 730-1 and 730-2, 740-1 and 740-2, 750-1 and 750-2 and 760-1 and 760-2. The structure of the semiconductor dies coupled in serial and packaged in the chips 710~760 is similar to the structure shown in FIG. 1. Therefore, descriptions of the circuit structure within the chip or the semiconductor package having semiconductor dies coupled in serial may refer to the descriptions of FIG. 1, and are omitted here for brevity. In addition, the structure of the chips or the semiconductor packages coupled in serial on the PCB is similar to the structure shown in FIG. 5. Therefore, descriptions of the circuit structure of a semiconductor device having chips or semiconductor packages coupled in serial may refer to the descriptions of FIG. 5, and are omitted here for brevity.

In addition, the signal transmission paths within a chip and among different chips and the pin connections are similar to the embodiment shown in FIG. 6. It is readily appreciated for the person of ordinary skill in the art to derive the signal transmission paths within a chip and among different chips of FIG. 7 based on the descriptions of FIG.

6. Therefore, details of the descriptions may refer to the descriptions of FIG. 6, and are omitted here for brevity.

In the embodiment shown in FIG. 7, a control signal output pin, for example, pin 36, of the chip 710 is electrically connected to a control signal input pin, for example, pin 29, of the chip 720 via at least one connecting element and/or the substrate thereon on the PCB 700. In addition, another control signal output pin, for example, pin 17, of the chip 710 is electrically connected to a control signal input pin, for example, pin 29, of the chip 730 via at least one connecting element and/or the substrate thereon on the PCB 700. Similarly, a control signal output pin, for example, pin 17, of the chip 720 is electrically connected to a control signal input pin, for example, pin 29, of the chip 740 via at least one connecting element of the PCB 700 and/or the substrate thereon. The rest may be deduced by analogy.

In the embodiment shown in FIG. 7, via the routings on PCB 700 and the internal signal transmission paths within chips as shown in FIG. 7, a control signal, such as the clock signal CLK, received from an external device via pin 29 of chip 710 may be routed or transmitted from the semiconductor die 710-1 to the semiconductor die 730-1, the semiconductor die 750-1, then routed or transmitted to the semiconductor die 750-2, the semiconductor die 730-2 and then to the semiconductor die 710-2. In addition, the control signal may be further routed or transmitted from the semiconductor die 710-2 to the semiconductor die 720-1, the semiconductor die 740-1, the semiconductor die 760-1, then routed or transmitted to the semiconductor die 760-2, the semiconductor die 740-2 and the semiconductor die 720-2. For another signal to be transmitted from the semiconductor device 75 to the external device (e.g. an CPU), the signal may be routed or transmitted to the external device in a reverse direction.

In some embodiments of the invention, one semiconductor package may also comprise more than two semiconductor die coupled in serial.

FIG. 8 is a top view diagram of a semiconductor package according to another embodiment of the invention. In this embodiment, the semiconductor device 800 may be a semiconductor package or a chip. The semiconductor device 800 comprises three semiconductor dies 810, 820 and 830 packaged therein and coupled in serial. The semiconductor dies 810, 820 and 830 may be configured to provide the same function. The pins (for example, the pins labeled with the numbers 1~30) marked by the leading term "D1" are the pins associated with the semiconductor die 810, the pins marked by the leading term "D2" are the pins associated with the semiconductor die 820 and the pins marked by the leading term "D3" are the pins associated with the semiconductor die 830.

As shown in FIG. 8, the power pad (or, the associated power pin) DVDD_1 of the semiconductor die 810 is electrically connected to the ground pad (or, the associated ground pin) DVSS_2 of the semiconductor die 820 and the power pad (or, the associated power pin) DVDD_2 of the semiconductor die 820 is electrically connected to the ground pad (or, the associated ground pin) DVSS_3 of the semiconductor die 830. In addition, the power pad DVDD_3 of the semiconductor die 830 may be configured to receive power from an external power source via a power node or a power pin of the semiconductor device 800, and the ground pad (or, the associated ground pin) DVSS_1 of the semiconductor die 810 may be further coupled to a ground node.

In this embodiment, among two adjacent semiconductor dies coupled in serial, the power pad (or, the associated power pin) of the lower semiconductor die and the ground pad (or, the associated ground pin) of the upper semiconductor die are equipotential. In addition, when the power V_Power is supplied, a predetermined current (that is, the same current) will flow through the semiconductor dies 830~810.

Figure 9:
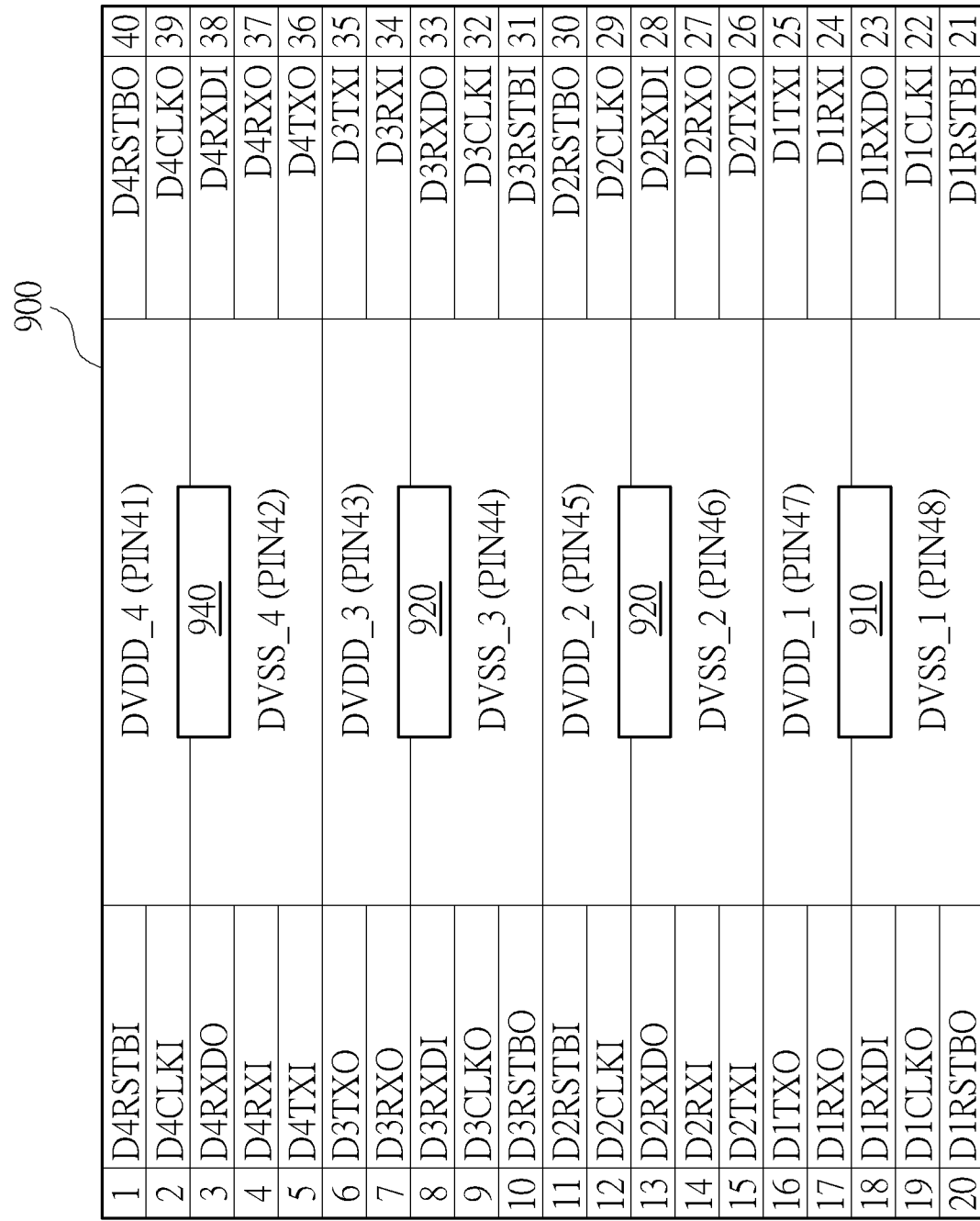
FIG. 9 is a top view diagram of a semiconductor package according to yet another embodiment of the invention.

FIG. 9 is a top view diagram of a semiconductor package according to yet another embodiment of the invention. In this embodiment, the semiconductor device 900 may be a semiconductor package or a chip. The semiconductor device 900 comprises four semiconductor dies 910, 920, 930 and 940 packaged therein and coupled in serial. The semiconductor dies 910, 920, 930 and 940 may be configured to provide the same function. The pins (for example, the pins labeled with the numbers 1~30) marked by the leading term "D1" are the pins associated with the semiconductor die 910, the pins marked by the leading term "D2" are the pins associated with the semiconductor die 920, the pins marked by the leading term "D3" are the pins associated with the semiconductor die 930 and the pins marked by the leading term "D4" are the pins associated with the semiconductor die 940.

As shown in FIG. 9, the power pad (or, the associated power pin) DVDD_1 of the semiconductor die 910 is electrically connected to the ground pad (or, the associated ground pin) DVSS_2 of the semiconductor die 920, the power pad (or, the associated power pin) DVDD_2 of the semiconductor die 920 is electrically connected to the ground pad (or, the associated ground pin) DVSS_3 of the semiconductor die 930, and the power pad (or, the associated power pin) DVDD_3 of the semiconductor die 930 is electrically connected to the ground pad (or, the associated ground pin) DVSS_4 of the semiconductor die 940. In addition, the power pad DVDD_4 of the semiconductor die 940 may be configured to receive power from an external power source via a power node or a power pin of the semiconductor device 900, and the ground pad (or, the associated ground pin) DVSS_1 of the semiconductor die 910 may be further coupled to a ground node.

In this embodiment, among two adjacent semiconductor dies coupled in serial, the power pad (or, the associated power pin) of the lower semiconductor die and the ground pad (or, the associated ground pin) of the upper semiconductor die are equipotential. In addition, when the power V_Power is supplied, a predetermined current (that is, the same current) will flow through the semiconductor dies 940~910.

Figure 10:
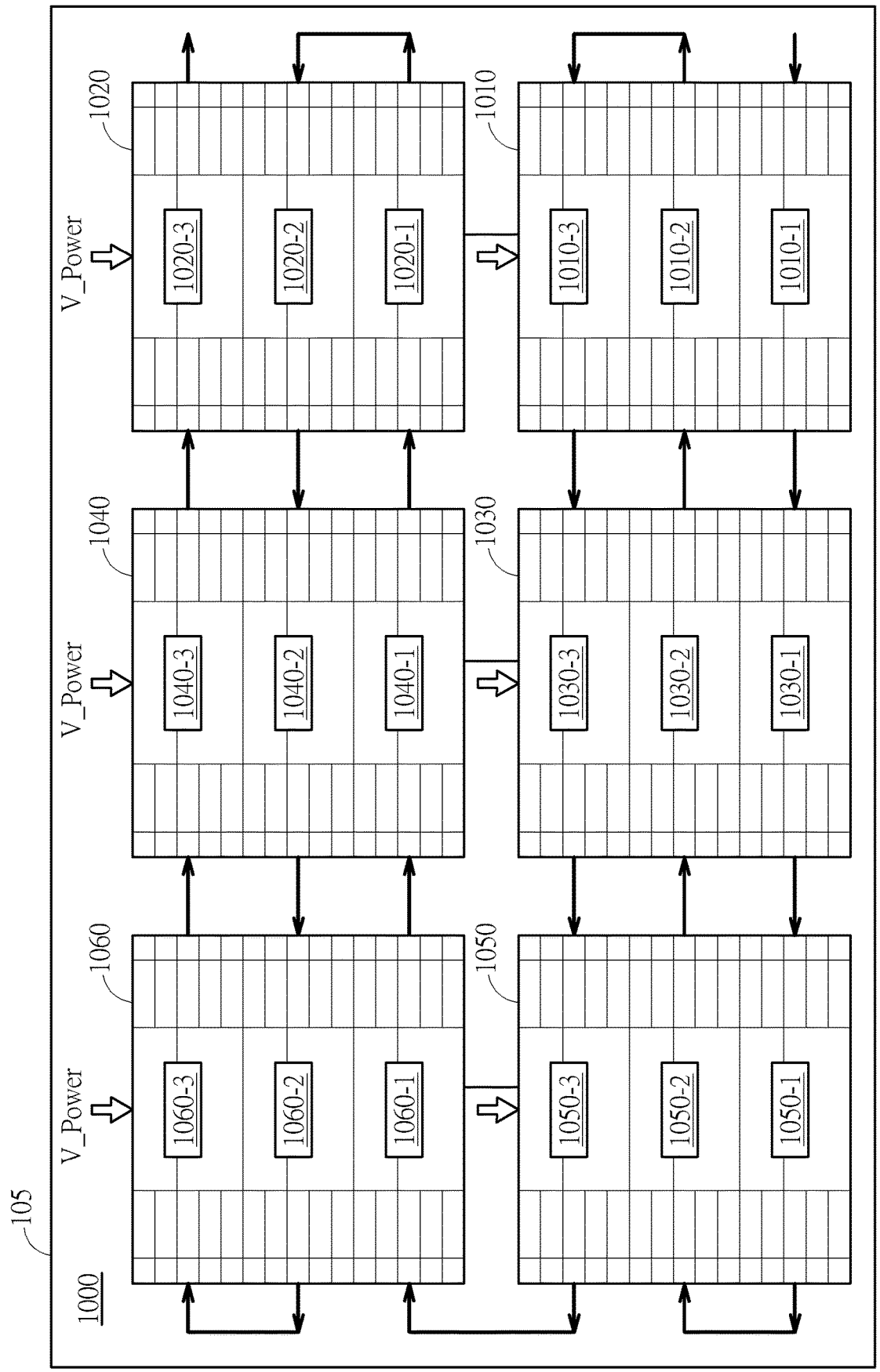
FIG. 10 is a schematic diagram showing six chips on the PCB according to another embodiment of the invention.

FIG. 10 is a schematic diagram showing six chips (or, semiconductor packages) on the PCB according to another embodiment of the invention, where each chip has three semiconductor dies packaged therein, and the semiconductor dies packaged in one chip are coupled in serial. The semiconductor dies or chips disposed on the PCB 1000 are configured to provide the same function.

In this embodiment, the semiconductor device 105 may comprise chips 1010~1060 mounted on the PCB 1000 and/or the substrate. The chip 1010 comprises semiconductor dies 1010-1, 1010-2 and 1010-3 packaged therein. The chip 1020 comprises semiconductor dies 1020-1, 1020-2 and 1020-3 packaged therein. The chip 1030 comprises semiconductor dies 1030-1, 1030-2 and 1030-3 packaged therein. The chip 1040 comprises semiconductor dies 1040-1, 1040-2 and 1040-3 packaged therein. The chip 1050 comprises semiconductor dies 1050-1, 1050-2 and 1050-3 packaged therein. The chip 1060 comprises semiconductor dies 1060-1, 1060-2 and 1060-3 packaged therein.

The chips 1010 and 1020, 1030 and 1040 and 1050 and 1060 are respectively coupled in serial between the power node for receiving the power V_Power and the ground node. In addition, the semiconductor device 105 may further comprise a parallel structure in which three chip sets (that is, the chip set comprising chips 1010 and 1020, the chip set comprising chips 1030 and 1040 and the chip set comprising chips 1050 and 1060) are coupled in parallel.

In FIG. 10, an exemplary signal routing path within the semiconductor device 105 is shown. Via the routings on PCB 1000 and the internal signal transmission paths within the chips, a signal received from an external device via chip 1010 may be sequentially routed or transmitted from one semiconductor die to another, and may be sequentially routed or transmitted from one chip to another, as the arrows shown in FIG. 10. For another signal to be transmitted from the semiconductor device 105 to the external device (e.g. a CPU), the signal may be routed or transmitted to the external device in a reverse direction.

The signal transmission paths within a chip and among different chips and the pin connections are similar to the embodiment shown in FIG. 7 and FIG. 8. It is readily appreciated for the person of ordinary skill in the art to derive the signal transmission paths within a chip and among different chips of FIG. 10 based on the descriptions of FIG. 7 and FIG. 8. Therefore, details of the descriptions may refer to the descriptions of FIG. 7 and FIG. 8, and are omitted here for brevity.

Figure 11:
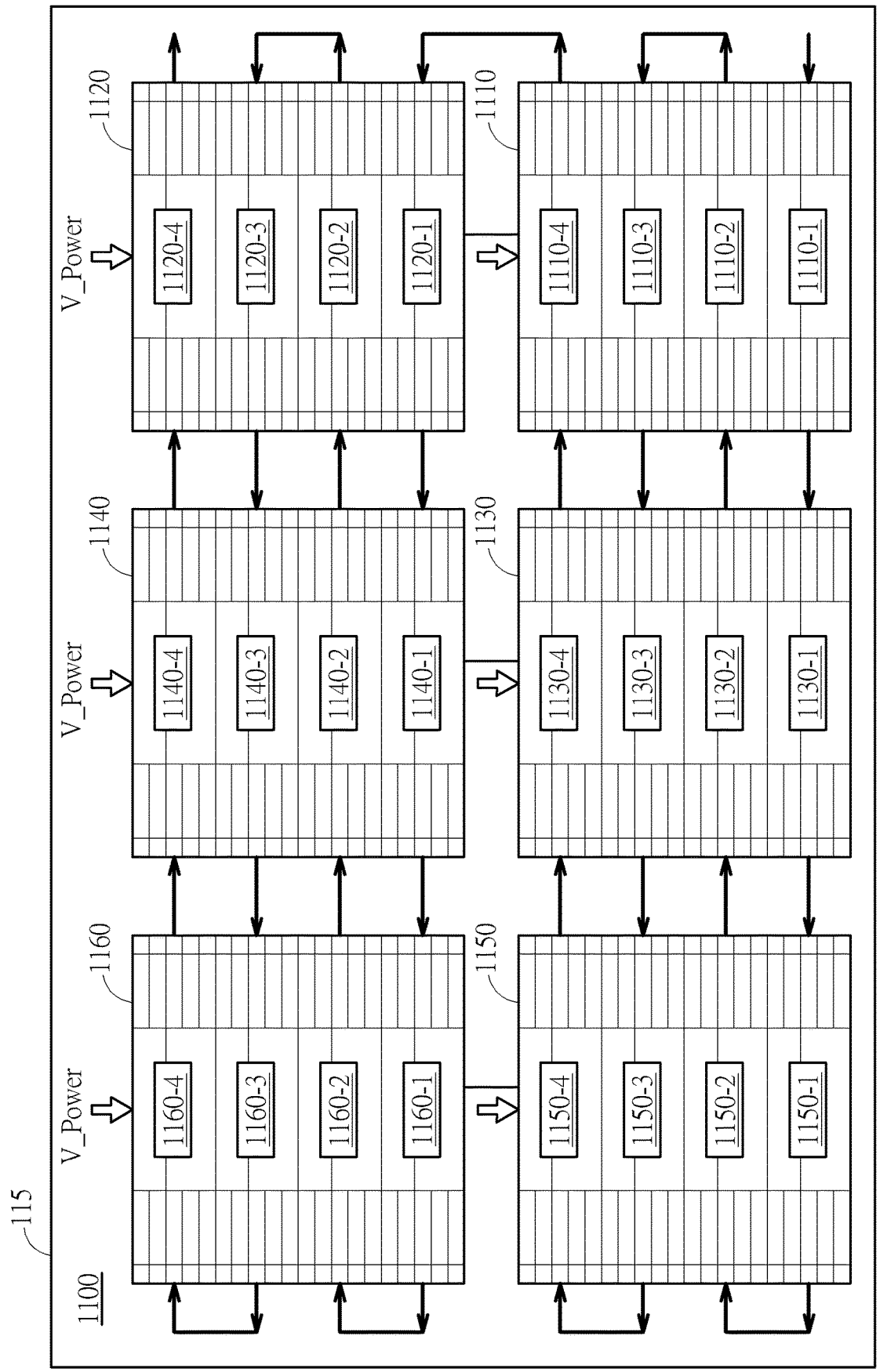
FIG. 11 is a schematic diagram showing six chips on the PCB according to yet another embodiment of the invention.

FIG. 11 is a schematic diagram showing six chips (or, semiconductor packages) on the PCB according to yet another embodiment of the invention, where each chip has four semiconductor dies packaged therein, and the semiconductor dies packaged in one chip are coupled in serial. The semiconductor dies or chips disposed on the PCB 1100 are configured to provide the same function.

In this embodiment, the semiconductor device 115 may comprise chips 1110~1160 mounted on the PCB 1100. The chip 1110 comprises semiconductor dies 1110-1, 1110-2, 1110-3 and 1110-4 packaged therein. The chip 1120 comprises semiconductor dies 1120-1, 1120-2, 1120-3 and 1120-4 packaged therein. The chip 1130 comprises semiconductor dies 1130-1, 1130-2, 1130-3 and 1130-4 packaged therein. The chip 1140 comprises semiconductor dies 1140-1, 1140-2, 1140-3 and 1140-4 packaged therein. The chip 1150 comprises semiconductor dies 1150-1, 1150-2, 1150-3 and 1150-4 packaged therein. The chip 1160 comprises semiconductor dies 1160-1, 1160-2, 1160-3 and 1160-4 packaged therein.

The chips 1110 and 1120, 1130 and 1140 and 1150 and 1160 are respectively coupled in serial between the power node for receiving the power V_Power and the ground node. In addition, the semiconductor device 115 may further comprise a parallel structure in which three chip sets (that is, the chip set comprising chips 1110 and 1120, the chip set comprising chips 1130 and 1140 and the chip set comprising chips 1150 and 1160) are coupled in parallel.

In FIG. 11, an exemplary signal routing path within the semiconductor device 115 is shown. Via the routings on PCB 1100 and the internal signal transmission paths within the chips, a signal received from an external device via chip 1110 may be sequentially routed or transmitted from one semiconductor die to another, and may be sequentially routed or transmitted from one chip to another, as the arrows shown in FIG. 11. For another signal to be transmitted from the semiconductor device 115 to the external device (e.g. an CPU), the signal may be routed or transmitted to the external device in a reverse direction.

The signal transmission paths within a chip and among different chips and the pin connections are similar to the embodiment shown in FIG. 7 and FIG. 9. It is readily appreciated for the person of ordinary skill in the art to derive the signal transmission paths within a chip and among different chips of FIG. 11 based on the descriptions of FIG. 7 and FIG. 9. Therefore, details of the descriptions may refer to the descriptions of FIG. 7 and FIG. 9, and are omitted here for brevity.

It should be noted that although in the embodiments of the invention, the serial power systems having a plurality of functional blocks (e.g. the computing circuits, the computing circuit macros, the semiconductor dies, the semiconductor packages or the chips) coupled in serial are proposed, the functional blocks can function simultaneously after they have been initialized and stabilized. When a great number of functional blocks, such as computing circuits, begin to perform corresponding functions at the same time, it can provide huge computing-power.

In addition, in the embodiments of the invention, since the same current will flow through the functional blocks coupled in serial, the power consumption can be greatly reduced. For example, for two dies connected in serial in one package, the current is half and the power consumption is half as well as compared to the structure having two dies coupled in parallel. In addition, the package-size of the proposed structure (for example, two or more dies connected in serial in one package) is smaller than that of the conventional structure having a single die in one package. Therefore, the BOM (Bill of Materials) list and circuit area on PCB can also be saved.

In addition, as discussed above, in the embodiments of the invention, based on the proposed structures, a smooth layout on package-substrate routing and a straightforward layout on PCB routing can be achieved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a printed circuit board; and
   a plurality of functional blocks, each being disposed on the printed circuit board and configured to provide at least one predetermined function,
   wherein the functional blocks at least comprise:
   a first functional block; and
   a second functional block,
   wherein the first functional block and the second functional block are coupled in serial with a first predetermined current flowing therethrough, and
   wherein at least one control signal received from the first functional block is relayed to the second functional block,
   wherein the first functional block is a first chip, the second functional block is a second chip, and wherein a power pin of the first chip is electrically connected to a ground pin of the second chip via a first connecting element of the printed circuit board and/or a substrate thereon.

2. The semiconductor device of claim 1, wherein at least one control signal output pin of the first chip is electrically connected to a control signal input pin of the second chip via a second connecting element of the printed circuit board and/or a substrate thereon.

3. The semiconductor device of claim 1, wherein the functional blocks further comprises a third functional block and a fourth functional block, the third functional block and the fourth functional block are coupled in serial with a second predetermined current flowing therethrough and the at least one control signal received from the first functional block is further relayed from the first functional block to the third functional block and relayed from the second functional block to the fourth functional block.

4. The semiconductor device of claim 3, wherein the third functional block is a third chip, the fourth functional block is a fourth chip, and a power pin of the third chip is electrically connected to a ground pin of the fourth chip via a second connecting element on the printed circuit board.

5. The semiconductor device of claim 3, wherein the third functional block is a third chip, the fourth functional block is a fourth chip, a first control signal output pin of the first chip is electrically connected to a control signal input pin of the second chip via a second connecting element on the printed circuit board, a second control signal output pin of the first chip is electrically connected to a control signal input pin of the third chip via a third connecting element on the printed circuit board, and a control signal output pin of the second chip is electrically connected to a control signal input pin of the fourth chip via fourth connecting element on the printed circuit board.

6. The semiconductor device of claim 1, wherein the first chip comprises a first semiconductor die and a second semiconductor die, the second chip comprises a third semiconductor die and a fourth semiconductor die, a power pad of the first semiconductor die is electrically connected to a ground pad of the second semiconductor die and a power pad of the third semiconductor die is electrically connected to a ground pad of the fourth semiconductor die.

7. A semiconductor device, comprising:
a printed circuit board; and
a plurality of functional blocks, each being disposed on the printed circuit board and configured to provide at least one predetermined function,
wherein the functional blocks at least comprise:
a first functional block; and
a second functional block,
wherein the first functional block and the second functional block are coupled in serial with a first predetermined current flowing therethrough, and
wherein at least one control signal received from the first functional block is relayed to the second functional block,
wherein the first functional block is a first semiconductor die, the second functional block is a second semiconductor die, the first semiconductor die and the second semiconductor die are packaged in a semiconductor package and a power pad of the first semiconductor die is electrically connected to a ground pad of the second semiconductor die.

8. The semiconductor device of claim 7, wherein the power pad of the first semiconductor die and the ground pad of the second semiconductor die are electrically connected to each other within the semiconductor package.

9. The semiconductor device of claim 7, wherein the power pad of the first semiconductor die and the ground pad of the second semiconductor die are electrically connected to each other via at least one connecting element on the printed circuit board.

10. A semiconductor device, comprising:
a printed circuit board; and
a plurality of functional blocks, each being disposed on the printed circuit board and configured to provide at least one predetermined function,
wherein the functional blocks at least comprise:
a first functional block; and
a second functional block,
wherein the first functional block and the second functional block are coupled in serial with a first predetermined current flowing therethrough, and
wherein at least one control signal received from the first functional block is relayed to the second functional block, and
wherein the first functional block is a first chip, the first chip comprises a first semiconductor die and a second semiconductor die, the second functional block is a second chip, the second chip comprises a third semiconductor die and a fourth semiconductor die, a power pad of the first semiconductor die is electrically connected to a ground pad of the second semiconductor die and a power pad of the third semiconductor die is electrically connected to a ground pad of the fourth semiconductor die.

* * * * *